United States Patent [19]

Yamazaki

[11] Patent Number: 4,810,661
[45] Date of Patent: Mar. 7, 1989

[54] PHOTOELECTRIC CONVERSION DEVICE AND METHOD FOR MANUFACTURING THE SAME

[75] Inventor: Shunpei Yamazaki, Tokyo, Japan

[73] Assignee: Semiconductor Energy Laboratory Co., Ltd., Kanagawa, Japan

[21] Appl. No.: 124,565

[22] Filed: Nov. 24, 1987

Related U.S. Application Data

[62] Division of Ser. No. 742, Jan. 6, 1987.

[30] Foreign Application Priority Data

Jan. 6, 1986 [JP] Japan .................................. 61-1006
Jan. 6, 1986 [JP] Japan .................................. 61-1007

[51] Int. Cl.$^4$ .......................................... H01L 31/18
[52] U.S. Cl. ....................................................... 437/3
[58] Field of Search .................... 437/3, 51, 205-207, 437/228, 229, 3; 357/30 H; 204/192.34

[56] References Cited

U.S. PATENT DOCUMENTS 4,290,844  9/1981  Rotolante et al. ................... 156/630
4,464,459  8/1984  Majima et al. ....................... 430/313

Primary Examiner—Aaron Weisstuch
Attorney, Agent, or Firm—Gerald J. Ferguson, Jr.

[57] ABSTRACT

A photoelectric conversion device is caused to have a quick response incident light by designing the photosensitive portion in such a way that photocurrent flows only in the direction perpendicular to a semiconductor layer. The device is comprised of the semiconductor and a pair of electrodes which are formed on the opposed surfaces of the semiconductor layer. The semiconductor layer is etched together with the electrodes so that the layer and the electrodes have the same area and the same shape.

6 Claims, 7 Drawing Sheets

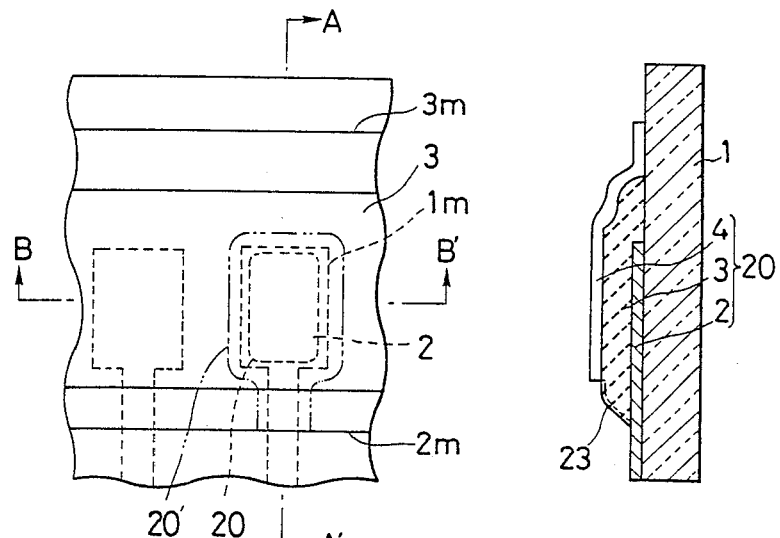
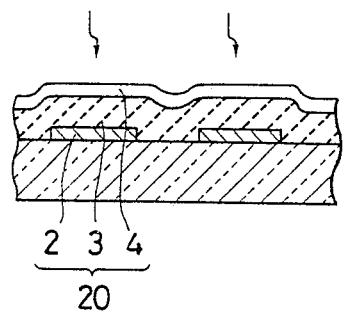
PRIOR ART FIG. 1(A)    PRIOR ART FIG. 1(B)
PRIOR ART FIG. 1(C)

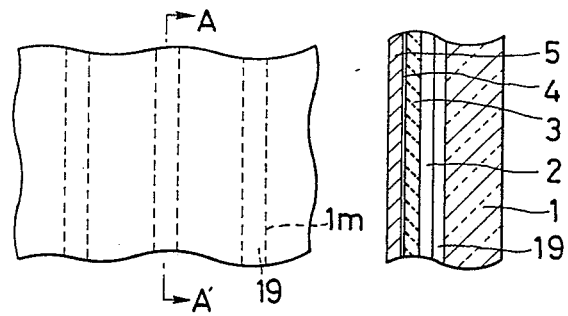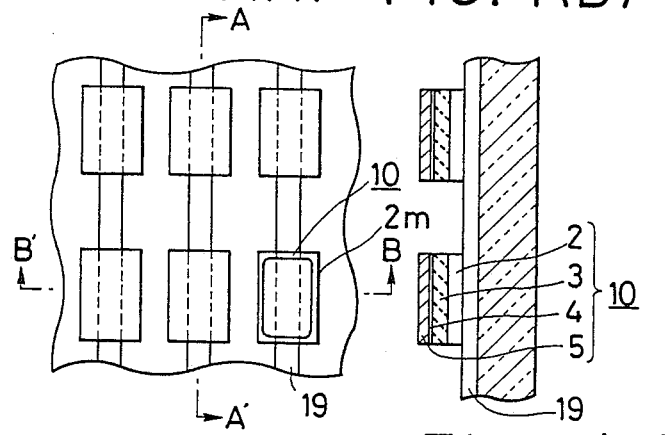
FIG.4(A) FIG.4(B)
FIG.4(C) FIG.4(D)

PHOTOELECTRIC CONVERSION DEVICE AND METHOD FOR MANUFACTURING THE SAME

RELATED APPLICATIONS

This Application is a divisional of U.S. Application Ser. No. 000,742, filed Jan. 6, 1987.

BACKGROUND OF THE INVENTION

The present invention relates to a photoelectric conversion device.

Heretofore a variety of applications of photoelectric conversion devices have been proposed. As an example of such an application, a contact image sensor for a facsimile machine is schematically illustrated in FIG. 1. The sensor is comprised of a photoelectric semiconductor layer 3 provided with a pair of electrodes 2 and 4 on the opposed surfaces, which are fabricated by lithography using three masks.

The fabrication method of this prior art device is as follows. First, a conductive layer of chromium is formed on a substrate 1 and patterned with a first mask 1m to form a plurality of first electrodes 2. Over the patterned electrode 2, a photosensitive intrinsic semiconductor layer of amorphous silicon is deposited to a thickness of 1 micrometer by a glow discharge method and patterned with a second mask 2m of a metal to form a photoelectric conversion layer 3. The amorphous silicon layer is formed in such a way that the patterned layer covers the first electrode 2 sufficiently even with a possible displacement of the mask 2m. Then, a conductive layer of indium tin oxide is formed on the semiconductor layer 3 and patterned with a third mask 3m to form a second electrode 4. A rectifying diode can be formed from a junction (MI junction) between the second electrode 4 and the semiconductor layer 3, i.e. a Schottky barrier.

When light is incident on the semiconductor layer 3 through the second electrode 4 as shown in FIG. 1(C), electron-hole pairs are generated in proportion to the intensity of the incident light.

The image sensor shown in FIGS. 1(A) to 1(C), however, is constructed with the semiconductor layer 3 larger than the first electrodes 2. Because of this, there are generated electron-hole pairs also in the region that is disposed vertically between the opposed electrodes 2 and 4 and lateral drifts of the carriers generated in the region take place. The lateral drift imparts a lag to the response.

On the other hand, the intrinsic semiconductor layer fabricated as described above tends to form a parasitic channel on an exposed surface thereof which is easily transformed into an n-type region, thereby causing a large dark current and dispersion in the quality of products. Further, the use of three masks reduces the cost effectiveness.

SUMMARY OF THE INVENTION

It is therefore an object of the invention to provide improved photoelectric conversion devices and methods for manufacturing the same.

It is another object of the invention to provide improved photoelectric conversion devices and methods for manufacturing the same capable of converting incident light on a real time basis.

It is a further object of the invention to provide improved photoelectric conversion devices and methods for manufacturing the same in which little time lag occurs in response to incident light.

It is still a further object of the invention to provide improved photoelectric conversion devices and methods for manufacturing the same with few parasitic channels on the photoelectric semiconductor of the device.

BRIEF DESCRIPTION OF THE DRAWINGS

FIGS. 1(A), (B), and (C) show a prior art image sensor;

FIGS. 4(A) through 4(J) are plan section views showing a two-dimensional contact image sensor in accordance with the present invention.

DETAILED DESCRIPTION OF THE PREFERRED EMBODIMENT

Figures 2A, 2B:
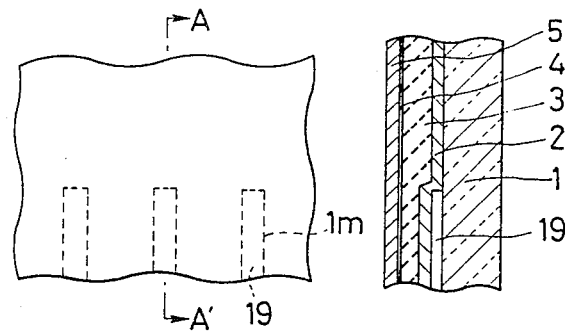
FIGS. 2(A) through 2(J) are plan section views showing a linear contact image sensor in accordance with the present invention.

Referring to FIGS. 2(A) to 2(J), an embodiment of the invention is illustrated according to the manufacturing process thereof.

On a heat resistant transparent substrate 1 such as a quartz plate or a Pyrex glass plate, a plurality of transparent electrode strips 19 of tin oxide are formed by using a first photo mask 1m. Further, a first conductive layer 2, a photosensitive semiconductor layer 3, and a second conductive layer 5 are formed in sequence. The first conductive layer 2 is an indium tin oxide layer 2000 A in thickness. The semiconductor layer 3 comprises at least a region of a substantially intrinsic semiconductor, such as an amorphous silicon semiconductor layer incorporating a p-i-n, n-i-n or m-i junction therein, each layer being deposited by a known CVD system. The i-type silicon semiconductor layer apparently has a slight n-type conductivity, so that it may be doped with a p-type impurity such as boron to make the semiconductor substantially intrinsic.

For instance, the semiconductor layer 3 is composed of a 200 A thick p-type semiconductor layer, a 3500 A thick intrinsic semiconductor layer, and a 300 A thick n-type semiconductor layer, which are deposited by a multi-chamber plasma enhanced CVD system (as disclosed in Japanese Patent Application No. 54-104452 by the applicant). In this case, the second conductive layer 5 is formed of chromium of 1000 A thickness and a transparent conductive layer 4 of chromium silicide is formed as a by-product with 10 to 200 A thickness between the semiconductor layer 3 and the chromium layer 5. The chromium silicide buffer layer 4 makes the contact between the semiconductor layer 3 and the electrode 5 ohmic.

Figures 2C, 2D:
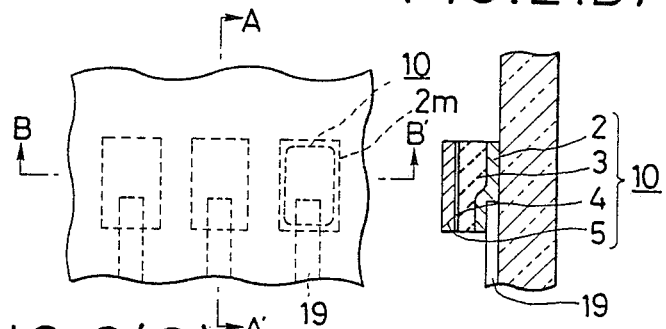
Figure 2E:
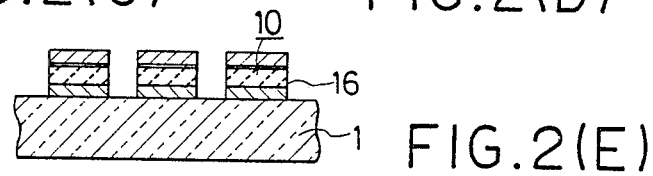

Next, the laminate of the conductive layers 2, 4 and 5 and the semiconductor layer 3 is integrally etched by means of a second mask 2m to produce cell blocks 10 on each strip 19 as shown in FIGS. 2(C), (D) and (E).

The cell blocks 10 constitute the sensitive portion of the contact image sensor, each being 150 micrometers in length and 100 micrometers in width with an interval of 30 micrometers, and are designed into a linear array.

Figure 2F:
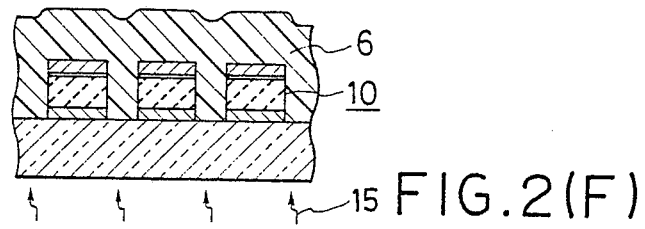
Figure 2G:
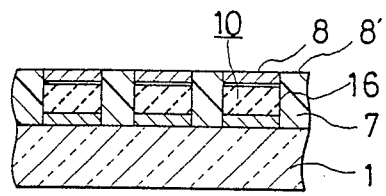
Figures 2H, 2I:
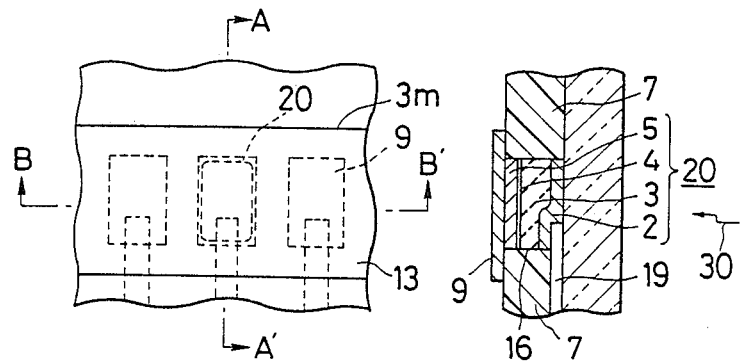
Figure 2J:
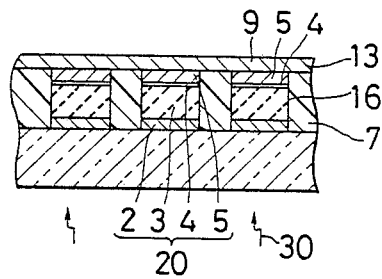

As shown in FIGS. 2(F), a photocurable organic resin layer 6, e.g., an aromatic polyimide precursor solution is formed with 1.6 micrometers thickness by a coating method so as to completely enclose the cell blocks 10. Then, the transparent substrate 1 is pre-baked in a clean oven at 80° C. for an hour and irradiated from the back surface thereof with ultraviolet light by a known mask aligner but using no mask. The irradiation time is about two minutes when an aligner distributed from Cobilt Co is used. After curing, the uncured portion of the resin layer is removed using a suitable rinsing liquid so that the top surface 8' of the remaining resin layer 7 is nearly flush with the top surface 8 of the cell blocks which are exposed therefore and surrounds the lateral sides 16 of the cell blocks. In this connection, the curing treatment reduces the volume of the resin approximately by a factor of 2, so that the thickness of the resin layer before curing is chosen to be about 1.6 micrometers for the cell blocks with 0.8 micrometer thickness. With ultraviolet light having 300 to 400 nm wavelength (10 mW/cm$^2$), the irradiation time is sufficient to be in the range of 15 to 30 seconds.

Finally, the substance 1 is heated in a nitrogen atmosphere at 180° C. for 30 minutes, at 300° C. for 30 minutes and at 400° C. for 30 minutes, and an aluminum layer 9 is formed to the thickness of 0.1 to 1.5 micron throughout the upper surface of the substrate 1 and etched by a third photomask 3m in such a way that the remaining aluminum layer traverse and covers over all the cell blocks in contact with the exposed surface of all the cell blocks 10. The aluminum electrode 9 straddles the cell blocks 10 and extends beyond the perimeter of the blocks, and therefore light entering the cell blocks 10 through the back side of the device is completely blocked. Then, the manufacturing of an image sensor with a smooth top surface is completed. For example, the cell blocks can be aligned 8 cells per 1 mm in a line.

The inventor has examined the vicinity of the contact between the cell blocks and the resin layer by an electron microscope in advance of forming the electrode 9. As a result, there have been observed unevenness but no cracks which tend to be a cause of short circuit currents between the opposed electrodes 2 and 5. There also have been observed no projections which might lead to a disconnection of patterns arranged thereon, and the two laterally adjacent layers are recognized as smoothly connected with each other. By virtue of this configuration, it becomes possible to superimpose an ITO (indium tin oxide) layer as the electrode 9 on the underlying layers without causing any possibility of disconnection at the position just above the interface.

The photoelectric conversion element 20 as the cell block thus formed is comprised of the first electrode 2 in contact with the line 19, the semiconductor layer 3, the second electrode 5 and the third electrode 9 in contact with the line 13. The semiconductor layer 3 is completely enclosed with the electrodes on the top and bottom surfaces and the resin layer at the side surfaces so that no current leakage and no parasitic channel takes place on the semiconductor layer.

Further, the opposed electrodes 2 and 5 can have the same area and the same shape as the semiconductor layer 3 regardless of the precision of the patterning.

An example of the photoelectric characteristics obtained by an experiment using a photoelectric device with p-i-n junctions according to the invention will be described hereinbelow. Namely, the dark current with an applied voltage of 3 V is $1.8 \times 10^{-13}$ A (the cell area; 100 microns $\times$ 150 microns) and the photo current with an irradiation of 100 Lx is $3.5 \times 10^{-8}$ A. The response characteristics of the device was such that incident light switching over one per microsecond could be followed up. A prior art device as described above could not follow up such a frequent change.

Another experiment was made for a photoelectric device incorporating n-i-n junctions therein. Characteristics of the current passing through the junction versus the applied bias was symmetrical about zero bias. The dark current was $4 \times 10^{-13}$ A and the photo conductivity with reference light of 100 Lx. The device could follow up satisfactorily intermittent irradiation at intervals of 0.2 microsecond.

Although the embodiment described in the above is constructed as a device which receives incident light through the substrate, the invention is also applicable to a device which receives incident light from the reverse side. Another embodiment of this type will be described with reference to FIGS. 3(A) through 3(D). In the manufacturing process for a device of this kind, the same steps as in the process for the previous embodiment can be employed until the step illustrated in FIG. 2(G), so that the process will be described only after said step.

Figure 3A:
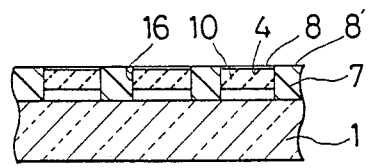
FIGS. 3(A) through 3(D) are plan and section views showing another linear contact image sensor in accordance with the present invention.

After depositing the resin layer 6 in FIG. 2(F), the resin layer 6 and the conductive layer 5 are removed in such a way that the surface of the remaining resin layer is flush with the chromium silicide layer 4 as shown in FIG. 3(A). The removal of the resin layer is carried out in the same manner as in the former embodiment.

Figures 3B, 3C:
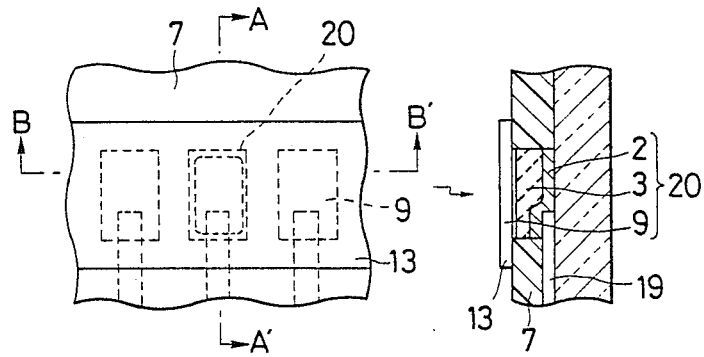
Figure 3D:
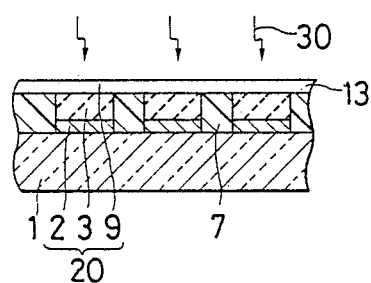

Finally, the substrate 1 is heated in a nitrogen atmosphere at 180° C. for 30 minutes, at 300° C. for 30 minutes and at 400° C. for 30 minutes, and an aluminum layer 9 is formed to a thickness of 0.1 to 1.5 micron throughout the upper surface of the substrate 1 and etched by a third photomask 3m in such a way that the remaining aluminum layer traverses and covers over all the cell blocks in contact with the exposed surface of all the cell blocks 10 as shown in FIGS. 3(B), 3(C) and 3(D). The aluminum electrode 9 straddles the cell blocks 20 and extends beyond the perimeter of the blocks, and therefore light entering the cell blocks 20 through the back side of the device is completely blocked. Then, the manufacturing of an image sensor with a smooth top surface is completed. For example, the cell blocks can be aligned eight cells per 1 mm of a line.

FIGS. 4(A) to 4(J) show a further embodiment of the invention in which cell blocks are arranged in a matrix. The embodiment demonstrates a two-dimensional contact image sensor.

On a heat resisting transparent substrate 1 such as a quartz plate or a Pyrex glass plate, a plurality of transparent electrode strips 19 of tin oxide ar formed by using a first photo mask 1m. Further, a first conductive layer 2, a photosensitive semiconductor layer 3, and a second conductive layer 5 are formed in sequence. The first conductive layer is an indium tin oxide layer 2000 A in thickness. The semiconductor layer comprises at least a region of a substantially intrinsic semiconductor, such as an amorphous silicon semiconductor layer incorporating a p-i-n, n-i-n or m-i junction therein, each layer being deposited by a known CVD system. The silicon semiconductor layer apparently has a slight n-type conductivity, so that it may be doped with a p-type impurity such as boron to make the semiconductor substantially intrinsic.

For instance, the semiconductor layer is composed of a 200 A thick p-type semiconductor layer, a 3500 A thick intrinsic semiconductor layer and a 300 A thick n-type semiconductor layer, which are deposited by a multi-chamber plasma enhanced CVD system (as disclosed by Japanese Patent Application No. 54-104452 by the applicant). In this case, the second conductive layer 5 is formed of chromium of 1000 A thickness and a transparent conductive layer 4 of chromium silicide is formed as a by-product with 10 to 200 A thickness between the semiconductor layer 3 and the chromium layer 5. The chromium silicide buffer layer 4 makes the contact between the semiconductor layer 3 and the electrode 5 ohmic.

Figure 4E:
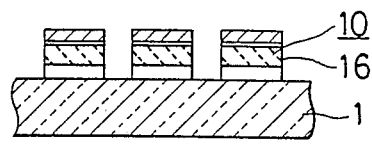

Next, the laminate of the conductive layers 2, 4 and 5 and the semiconductor layer 3 is integrally etched by means of a second mask 2m to produce a plurality of cell blocks 10 on each strip 19 as shown in FIGS. 4(C), 4(D) and 4(E).

The cell blocks 10 are arranged in the form of a matrix, in order to constitute a two-dimensional contact image sensor. The cell blocks 10 are the sensitive portion of the contact image sensor, each being 150 micrometers long and 100 micrometer wide with an interval of 30 micrometers.

Figure 4F:
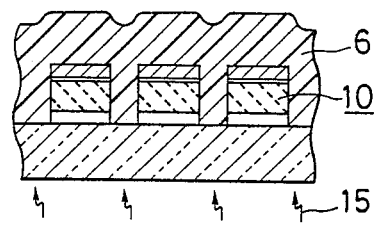
Figure 4G:
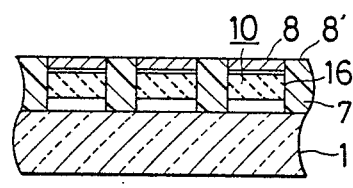
Figures 4H, 4I:
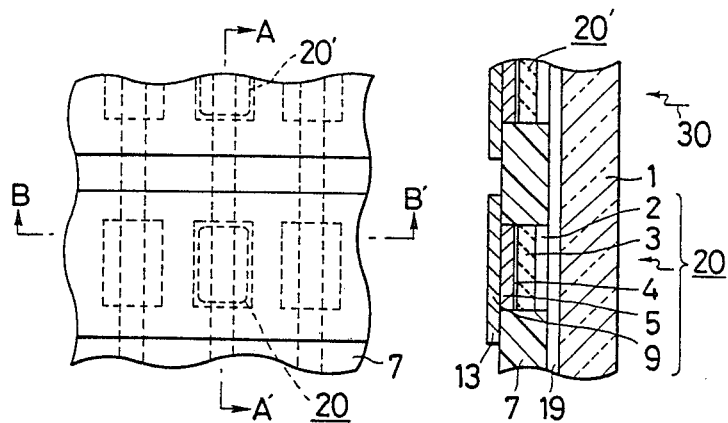
Figure 4J:
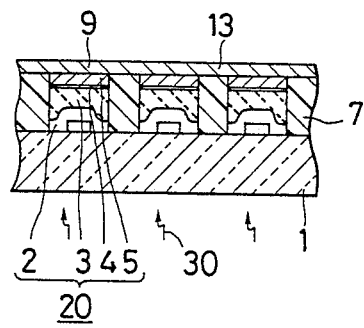

As shown in FIG. 4(F), a photocurable organic resin layer 6, e.g., an aromatic polyimide precursor solution is formed with 1.6 micrometers thickness by a coating method so as to completely enclose the cell blocks 10. Then, the transparent substrate 1 is pre-baked in a clean oven at 80° C. for an hour and irradiated from the back surface thereof with ultraviolet light by a known mask aligner but using no mask. The irradiation time is about two minutes when an aligner distributed form Cobilt Co. is used. After curing, the uncured portion of the resin layer is removed using a suitable rinsing liquid so that the remaining resin layer 6 is nearly flush with the top surface of the cell blocks which, therefore, are exposed. In this connection, the curing treatment reduces the volume of the resin approximately by a factor of 2, so that the thickness of the resin layer before curing is chosen to be about 1.6 micrometer for cell blocks with 0.8 micrometer thickness. With ultraviolet light having 300 to 400 nm wavelength (10 mW/cm$^2$), the irradiation time is sufficient to be in the range of 15 to 30 seconds.

Finally, the substrate 1 is heated in a nitrogen atmosphere at 180° C. for 30 minutes, at 300° C. for 30 minutes and at 400° for 30 minutes, and a plurality of separate aluminum layers 9 are formed to a thickness of 0.1 to 1.5 microns throughout the upper surface of the substrate 1 and etched by a third photomask 3m in such a way that the blocks in each row of the matrix are covered completely by one of the aluminum layers which remain separately extending along rows of the matrix. The aluminum electrode 9 straddles the cell blocks 20 and extends in the column direction beyond the perimeter of the blocks, and therefore light entering the cell blocks 20 through the back side of the device is completely blocked. Then, the manufacturing of an image sensor with a smooth top surface is completed. For example, the cell blocks can be formed to a density of 64 cells per square milimeter.

The photoelectric conversion element 20 as the cell block thus formed is comprised of the first electrode 2 in contact with the line 19, the semiconductor layer 3, the second electrode 4 and the third electrode 5 in contact with the line 13. The semiconductor layer 3 is completely enclosed wtih the electrodes at the top and bottom surfaces and the resin layer at the side surfaces so that no current leakage occurs and no parasitic channels form on the semiconductor.

Further, the opposed electrodes 2 and 5 can have the same area and the same shape as the semiconductor layer 3 regardless of the precision of the patterning.

As described in the above, a device according to the present invention is comprised of laminated layers in which the peripheries thereof are surrounded respectively by a resin layer. The upper surface of the laminate is exposed as if the resin layer is not provided. Although the surfaces of the laminate and the resin layer are configured preferably flush with each other, the resin layer may be formed with its upper surface positioned lower than that of the member.

The present invention is useful especially for an image sensor because a number of sensor elements can be finely disposed on a substrate without causing crosstalk between adjacent ones and because the sensor elements maintain high reliability for a long time and have a high abrasion resistance against external impacts.

It should be understood that the present invention is not limited to the specified embodiment but only to the appended claims, and a variety of modifications and changes of the embodiments may occur to those skilled in the art.

Although the embodiments have been described as to contact image sensors, the present invention can be applied also to photoelectric conversion devices of other types which have only one or a few conversion elements. A photoelectric conversion semiconductor layer can incorporate p-i, n-i, m-i (Schottky contact), n-i- or m-i-n junctions, besides p-i-n or n-i-n junctions. The semiconductor substance to be used for the invention may be $Si_xGe1-x(0<x\leqq1)$, $SixCl-x(0<x\leqq1)$ or $SixSnl-x$ $(0<x\leqq1)$.

What is claimed is:

1. A method for manufacturing an image sensor composed of a plurality of sensor elements, said method comprising:
   preparing a substrate;
   forming a first electrode on said substrate;
   forming a photoelectric semiconductor layer on said first electrode;
   forming a second electrode on said semiconductor layer; and
   simultaneously removing selected portions of said first and second electrodes and said semiconductor layer using a plurality of masks on said second electrode which are located in positions corresponding to the respective sensor elements.

2. A method of claim 1 further comprising a step of forming a plurality of conductive lines for extracting the outputs of said elements.

3. A method of claim 1 further comprising a step of disposing a resin layer between said elements.

4. A method of claim 3 wherein said substrate is transparent.

5. A method of claim 4 wherein said resin layer is formed from a negative photoresist by photoetching with said elements as masks.

6. A method of claim 5 wherein the etching condition is so chosen that the remaining resin layer is flush with said semiconductor layer.

* * * * *